United States Patent [19]

Hori

[11] Patent Number: 4,821,273
[45] Date of Patent: Apr. 11, 1989

[54] WAVELENGTH/OUTPUT POWER STABILIZING APPARATUS OF SEMICONDUCTOR LASER

[75] Inventor: Nobuo Hori, Tokyo, Japan

[73] Assignee: Tokyo Kogaku Kikai Kabushiki Kaisha, Tokyo, Japan

[21] Appl. No.: 38,660

[22] Filed: Apr. 15, 1987

[30] Foreign Application Priority Data

Apr. 16, 1986 [JP] Japan .................................. 61-87349

[51] Int. Cl.$^4$ ................................................. H01S 3/10
[52] U.S. Cl. ........................................ 372/31; 372/32; 372/34
[58] Field of Search ...................... 372/29, 31, 32, 38, 372/36, 34, 33

[56] References Cited

U.S. PATENT DOCUMENTS

4,066,365 1/1978 Staunton .............................. 356/244
4,450,565 5/1984 Copeland .............................. 372/32

FOREIGN PATENT DOCUMENTS

53-1782 10/1978 Japan .
0052891 3/1983 Japan .................................... 372/32

OTHER PUBLICATIONS

Japanese language article, "Frequency and Power Stabilization of GA A AS Diode Laser on an Opto Galvanic Effect," Shingaku Giho, vol. 82, No. 218, published Jan. 17, 1983.

Primary Examiner—James W. Davie
Attorney, Agent, or Firm—Finnegan, Henderson, Farabow, Garrett & Dunner

[57] ABSTRACT

An apparatus for stabilizing the wavelength/output power of a semiconductor laser is disclosed. It includes an injection current supplying source for supplying an injection current to a single-mode semiconductor laser; an output power variation detecting portion for detecting the variation of the output power; a wavelength variation detecting portion which has a light receiving portion for receiving a part of the output power of the semiconductor laser through an optical element whose spectral characteristics are varied in the wavelength area of the semiconductor laser and a processing portion for obtaining a variation of the wavelength of the semiconductor laser; an operating temperature stabilizing portion which comprises an operating temperature detecting portion and adapted to detect an operating temperature thereof, a thermoelectric element for forwarding and receiving heat to and from the semiconductor laser, and an operating temperature controlling portion for controlling the thermoelectric element, an output of the heat value detecting portion, and an output of the output power variation detecting portion; and an injection current controlling portion for controlling the injection current of the injection current source.

8 Claims, 5 Drawing Sheets

WAVELENGTH/OUTPUT POWER STABILIZING APPARATUS OF SEMICONDUCTOR LASER

BACKGROUND OF THE INVENTION

This invention relates to a wavelenght/output power stabilizing apparatus of a semiconductor laser which is capable of stabilizing the wavelength/output power of a single-mode semiconductor laser (it is also referred to as a laser diode; LD).

In recent years, a semiconductor laser has been used for various equipment equipped with an optical system since the converting efficiency of an output energy with respect to an input energy is large. This semiconductor laser has such character as that its wavelength and output power are varied depending on variation of the operating temperature of the semiconductor laser. The wavelength/output power are also varied according to variation of injection current of a current supply source for supplying an injection current to the semiconductor laser (see a search report under the title of "Frequency and Power Stabilizations of GaAlAs Diode Laser on an Opto galvanic Effect" of Shingaku Giho Vol. 82 No. 218, OQE-99 of Technical Search Report of Denshitsunshin Gakkai; OQE82-95 to 106 (issued on Jan. 17, 1983)).

More specifically, the variation $\Delta\lambda$ of the wavelength $\lambda$ of a semiconductor laser and the variation $\Delta P$ of its output power P are expressed by a function of the variation of $\Delta I$ of an injection current I and the variation $\Delta T$ of the operating temperature $T_T$ of the semiconductor laser.

The relations therebetween are as follows;

$$\Delta\lambda = \left(\frac{\partial\lambda}{\partial I} + \frac{\partial\lambda}{\partial T} \cdot \frac{dT}{dI}\right) \cdot \Delta I + \frac{\partial\lambda}{\partial T} \cdot T \quad (A)$$

$$\Delta P = \left(\frac{\partial P}{\partial I} + \frac{\partial P}{\partial T} \cdot \frac{dT}{dI}\right) \cdot \Delta I + \frac{\partial P}{\partial T} \cdot T \quad (B)$$

In the above relations, dT/dI represents the increase of temperature of the laser as a function of the injection current I injected by the semiconductor laser.

In the above research report, in order to stabilize the wavelength/output power, there are shown means for feeding back the variation of the wavelength output power to the operating temperature and feeding back the variation of the wavelength to the injection current and means for feeding back the variation of the output power to the injection current and feeding back the wavelength to the operating temperature. However, according to the afore-mentioned means, since the output power or wavelength is controlled by the feed-back to the operating temperature, with an environmental temperature variation, the system is slow in its responsive speed, and temporary variation of wavelength/output power is allowed.

If T equals constant, $\Delta T=0$, $dT/dI=0$, $\partial P/\partial T=0$ are obtained. Therefore, the relations (A) and (B) can be rewritten as follows;

$$\Delta\lambda = \left[\frac{\partial\lambda}{\partial I} \cdot \Delta I\right] T = \text{const} \quad (A')$$

$$\Delta P = \left[\frac{\partial P}{\partial I} \cdot \Delta I\right] T = \text{const} \quad (B')$$

These relations principly indicate that if the variation $\Delta P$ of the output power P is constant, the variation $\Delta I$ of the injection current I is restricted, and if the variation $\Delta I$ of the injection current I is restricted, the variation $\Delta\lambda$ of the wavelength is restricted, thus stabilizing the wavelength of the semiconductor.

Because of the above-mentioned phenomena, in order to stabilize the wavelength/output power of the semiconductor laser, it is preferred that the variation $\Delta I$ of the injection current I is restricted while maintaining the operating temperature $T_T$ of the injection current I constant.

In view of the above, in order to maintain the operating temperature of the semiconductor laser at a specified temperature, it can be considered that a temperature controlling apparatus (see Japanese Patent Early Laid-open Publication No. 53-1782) having a Peltier element as a thermoelectric element is used. However, the employment of the temperature controlling apparatus has the following problems. That is, when a semiconductor laser is used, the semiconductor laser itself is heated by the injection current. Therefore, if the thermoelectric element is controlled in such a way as to bring the operating temperature close to the specified temperature based on the temperature difference between the operating temperature of the semiconductor laser and the specified temperature, the operating temperature differs from the specified temperature due to variations of the environmental temperature caused by the heating of the semiconductor laser. In addition, the operating temperature is difficult to be stabilized for a long time due to seccessive variation of the thermal resistance of the semiconductor laser element and/or successive variation of the element forming the temperature controlling apparatus.

The above-mentioned problems will be described more in detail with reference to FIG. 1 and 2.

Figure 1:
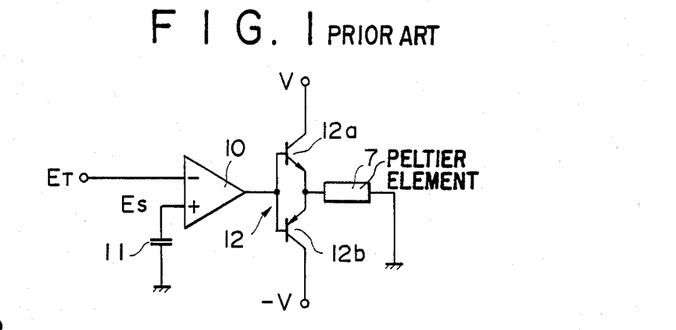
FIG. 1 is a schematic view showing the construction of a conventional operating temperature controlling portion.

FIG. 1 is a schematic view of an operating temperature controlling portion for stabilizing the operating temperature of a semiconductor laser 1. FIG. 2 is a schematic view of a thermoelectric converting apparatus 6 for stabilizing the operating temperature of the semiconductor laser 1. The thermoelectric converting apparatus 6 is provided with the semiconductor laser 1 on one side of a Peltier element 7 and with a radiating plate 8 on the other side thereof. The thermoelectric converting apparatus 6 contains a thermistor 9.

The thermistor 9 detects the operating temperature $T_T$ of the semiconductor laser 1, and the operating temperature $T_T$ is voltage-converted into an operating temperature converting voltage $E_T$ by a temperature voltage converting circuit 32. This operating temperature converting voltage $E_T$ is inputted into one terminal of an operational amplifier 10. The other terminal of the operational amplifier 10 is inputted with a reference voltage $E_S$ corresponding to a specified temperature $T_S$ by a reference power source 11. The operational amplifier 10 compares the reference voltage $E_S$ and the operating temperature converting voltage $E_T$ and outputs the different output towards a transistor 12. The transistor 12 comprises a transistor 12a and a transistor 12b. The current flowing direction of the Peltier element 7 is converted by the transistor 12 so that when $E_T>E_S$ and $T_T>T_S$, the transistor 12 is controlled so that the semiconductor laser 1 is cooled by the Peltier element 7, whereas when $E_T<E_S(T_T<T_S)$, the transistor 12 is controlled so that the semiconductor laser 1 is heated by the Peltier element 7. As a result, the operating temperature $T_T$ of the semiconductor laser 1 is controlled as as to approach to the specified temperature $T_S$, reaches a balance-state and becomes a balanced-temperature Te.

In the operating temperature controlling portion, however, the operating temperature $T_T$ is varied based on variation of the environmental temperature $T_h$ and heat value of the semiconductor laser 1.

Figures 2, 3:
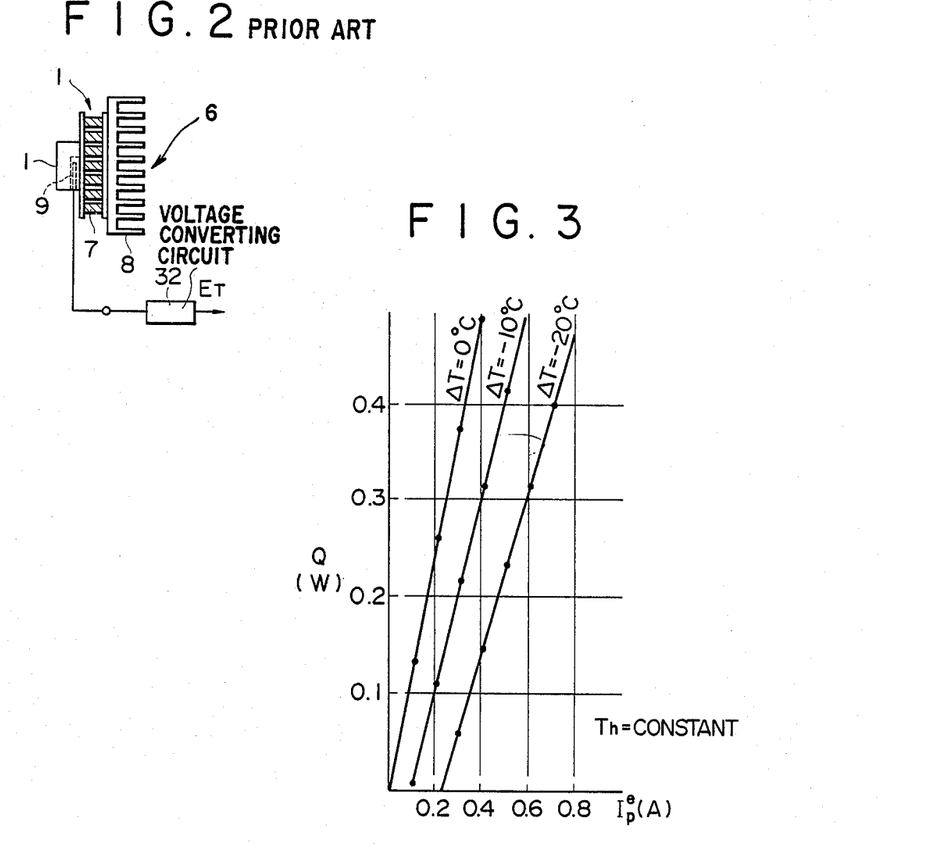
FIG. 2 is a schematic view showing the construction of a conventional thermoelectric converter.
FIG. 3 is a characteristic illustration showing the relation between a heat value of a Peltier element and a balanced-current flowing in the Peltier element.

For example, the Peltier element 7 has such characteristics as shown in FIG. 3. The illustration of FIG. 3 showing the characteristics is based on the Peltier element 7 of KSM-0211 manufactured by Komatsu Electronics. In this FIG. 3, the vertical axis shows a heat value Q as a heating load incurred to the Peltier element 7, whereas the horizontal axis shows a balanced-current $I_P$ which flows in the Peltier element 7. The parameter T is a temperature difference between the operating temperature $T_T$ when it reaches the balanced-state ($T_T=T_T$ at this time) and the environmental temperature $T_h$ as a temperature at the radiating side of the Peltier element 7 and is represented by the following relation;

$$\Delta T \equiv Te - T_h$$

The temperature difference T=0 means that the balanced-temperature Te is equal to the environmental temperature $T_h$.

As is apparent from FIG. 3, when a heating element (Q≠0) is used, even when, for example, the temperature difference T=0° C., a balanced-current $I_p$ flows in the Peltier element 7 so as to release a heat value Q. In this case, the operating temperature converting voltage $E_T$ when the operating temperature $T_T$ reaches the balanced-temperature Te is a balanced-temperature corresponding voltage Ee. Furthermore, if the voltage/current converting coefficient of the operating temperature contolling portion shown in FIG. 1 is represented by α, the balanced-temperature corresponding voltage Ee corresponding to the balanced-temperature of the semiconductor laser 1 when the heat is balanced can be obtained by the following relation;

$$Ee = E_S + \frac{I_1^e}{\alpha} \qquad (1)$$

which is obtained by rewriting the relation of $I_1^e = -(Ee - E_S)$.

In the above relation, $I_1$ represents a current flowing in the Peltier element 7 when the specified temperature $T_S$ and the environmental temperature $T_h$ are equally controlled. At that time, a relation of $E_S = E_h$ is obtained between the reference voltage $E_S$ and the environmental temperature corresponding voltage $E_h$.

Furthermore, since the balanced current $I_p^e$ and the heat value Q are in linear relation when the heat value Q is in the small range as shown in FIG. 3, the heat value Q can be represented by the following relation;

$$Q = \beta \cdot I_1^e \qquad (2)$$

wherein β is a converting coefficient.

Therefore, based on the relations (1) and (2), the balanced-temperature corresponding voltage Ee can be obtained by the following relation;

$$Ee = E_S + \frac{Q}{\alpha \cdot \beta} \qquad (3)$$

This relation (3) shows that it becomes $Ee = E_S(\Delta T = 0)$ since the controlling circuit controls so as to make $E_S - E_T = E_S - Ee = 0$ when the reference voltage $E_S$ is set to be equal to the environmental temperature corresponding voltage $E_h$ when Q=0. It also shows that it becomes as follow;

$$Ee \neq E_S \qquad (4)$$

even if it is set as $E_S = E_h$ so as to set the specifiedting temperature $T_S$ and environmental temperature $T_h$ equally when Q≠0. That is, this relation shows that when a heating element such as the semiconductor laser 1 is used, the balanced-temperature corresponding voltage Ee corresponding to the balanced temperature Te is not equal to the reference voltage $E_S$ corresponding to the specified temperature $T_S$ and that in this operating temperature stabilizing circuit, the balanced-temperature Te is shifted with respect to the specified temperature $T_S$ by a value which is in proportion to the size of the heat value Q, i.e., a value which is equal to $Q/(\alpha \cdot \beta)$. The heat value Q is in proportion to the injection current I of the semiconductor laser 1.

Figure 4:
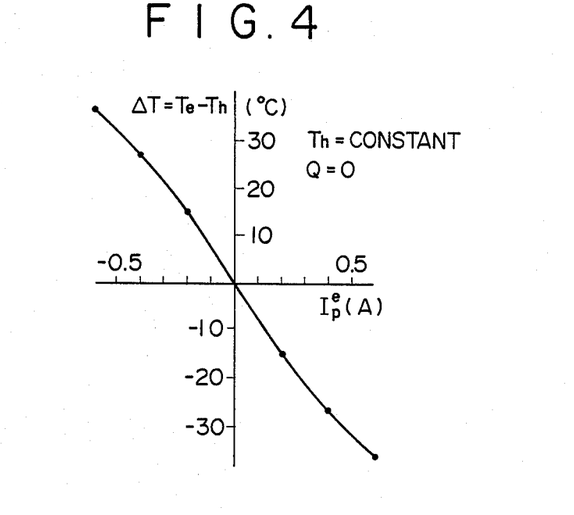
FIG. 4 is a characteristic illustration showing the relation between a balanced-current and a temperature difference when there is the temperature difference between an operating temperature and an environmental temperature under the condition in which the heat value is zero.

The environmental temperature $T_h$ is not constant but variable. The specified temperature $T_S$ is not necessarily in agreement with the environmental temperature $T_h$. When the balanced-temperature Te is different from the environmental temperature $T_h$ ($\Delta T = Te - T_h \neq 0$), a balanced-current $I_2$ is flowed in the Peltier element 7 even when the heating element is not used as shown in FIG. 3. FIG. 4 is an illustration of the characteristics of the Peltier element 7 in which the relation between $\Delta T = Te - T_h$ and the balanced-current $I_2^e$ when Q=0. The balanced temperature corresponding voltage Ee can be obtained from the following relation;

$$Ee = E_S + \frac{I_2^e}{\alpha} \qquad (5)$$

which is obtained by rewriting $I_2^e = \alpha(Ee - E_S)$. In the portion where the temperature T between the balanced temperature Te and the environmental temperature $T_h$ is small ($\Delta T \leq 15°$ C.), the temperature difference $\Delta T$ and the balanced-current $I_2^e$ are in linear relation. Therefore, the temperature difference $\Delta T$ can be represented by the following relation;

$$\Delta T = -\gamma \cdot I_2^e \qquad (6)$$

wherein the flowing direction of the balanced-current $I_2^e$ flowing in the Peltier element 7 is normal when it flows in the direction for cooling the semiconductor laser 1 as a test sample, and γ is a converting coefficient.

By using this relation (6), if the balanced-temperature corresponding voltage Ee is shown as a function of the temperature difference $\Delta T$ by rewriting the relation (5), it can be represented by the following relation;

$$Ee = E_S - \frac{1}{\alpha \cdot \gamma} \Delta T \qquad (7)$$

Accordingly, if the operating temperature controlling portion which is shown in FIG. 1 is used, the balanced-temperature corresponding voltage Ee corresponding to the balanced-temperature Te is not in accord with the reference voltage $E_S$ when the specified temperature $T_S$ and the environmental temperature $T_h$ are not in accord. The differnece $Ee-E_S$ means that the balanced-temperature Te is shifted by a value which is in proportion to $\Delta T$ with respect to the specified temperature $T_S$.

More specifically, even if the specified temperature $T_S$ is constant, the temperature difference T varies when the environmental temperature $T_h$ varies. Accordingly, since the balanced-temperature Te is varied by the influence of the environmental temperature $T_h$, the operating temperature $T_T$ is not constant.

Next, when a heating element is used, and the environmental temperature $T_h$ and the specified temperature $T_S$ are not in agreement with respect to each other, the balanced-current $I_p$ is represented according to the principle of superimposition by the following relation;

$$I_P{}^e = I_1{}^e + I_2{}^e = \frac{Q}{\beta} - \frac{\Delta T}{\gamma} \qquad (8)$$

This relation (8) can be rewritten according to the relation (1) as follows;

$$Ee - E_S = \frac{I_P{}^e}{\alpha} = \frac{Q}{\alpha \cdot \beta} - \frac{\Delta T}{\alpha \cdot \beta}$$

and the following relation can then be obtained;

$$E_e = E_S + \frac{Q}{\alpha \cdot \beta} - \frac{\Delta T}{\alpha \cdot \beta} \qquad (9)$$

In this way, the balanced-temperature Te (corresponding voltage Ee) varies according to the heat value Q of the semiconductor laser and variation of the difference T between the specified temperature $T_S$ and the environmental temperature $T_h$.

Accordingly, it is unexpected that the operating temperature $T_T$ is stabilized for a long time by such operating temperature controlling portion as mentioned. Furthermore, even if it is assumed that the operating temperature $T_T$ at the place where the thermistor 9 is disposed is constant, there is no guarantee that the operating temperature $T_T$ of the semiconductor laser 1 is stabilized for a long time due to successive variation of thermal resistance between the thermistor 9 and the semiconductor laser 1 and successive variation of the thermistor 9 itself. There is no guarantee either that the output power P itself is constant since the operating temperature $T_T$ is not controlled by considering the variation of the output power P.

Therefore, it is difficult to stabilize both the wavelength of the semiconductor laser 1 and output power thereof.

SUMMARY OF THE INVENTION

It is therefore the object of the present invention to provide an apparatus for stabilizing the wavelength/output power of a semiconductor laser in which the wavelength and the output power of a semiconductor laser can be stabilized for a long time.

In order to achieve the above object, there is essentially provided an apparatus for stabilizing the wavelength/output power of a semiconductor laser including an injection current supplying source for supplying an injection current to a single-mode semiconductor laser, an output power variation detecting portion for detecting the variation of the output power by receiving a part of the output power of the semiconductor laser; a wavelength variation detecting portion which has a light receiving portion for receiving a part of the output power of the semiconductor laser through an optical element whose spectral characteristics are varied in the wavelength area of the semiconductor laser and a processing portion for obtaining a variation of the wavelength of the semiconductor laser based on the output of the light receiving portion and the output of the output power variation detecting portion; a heat value detecting portion for detecting a heat value which said semiconductor laser generates, an operating temperature stabilizing portion which comprises an operating temperature detecting portion provided to the semiconductor laser and adpated to detect an operating temperature thereof, a thermoelectric element for forwarding and receiving heat to and from the semiconductor laser, and an operating temperature controlling portion for controlling the thermoelectric element so as to bring the operating temperature in accord with a specified temperature while maintaining the output power constant based on a reference signal corresponding to the specified temperature, an output of the heat value detecting portion, and an output of the output power variation detecting portion; and an injection current controlling portion for controlling the injection current of the injection current source so as to maintain the wavelength constant based on an output of the wavelength variation detecting portion.

According to an apparatus for stabilizing the wavelength/output power of a semiconductor laser of the present invention, an operating temperature stabilizing circuit controls a thermoelectric element so as to bring an operating temperature in accord with a specified temperature while maintaining the output power constant based on the output of a wavelength output power variation detecting portion for detecting the variation of the output power by receiving a part of the output power of the semiconductor laser, a reference voltage corresponding to the specified temperature and the output of the heat value detecting portion, and an injection current controlling portion controls the injection current of the injection current supplying source so as to maintain the wavelength constant based on the output of the wavelength variation detecting portion for detecting the variation of the wavelength by receiving a part of the wavelength output power of the semiconductor laser.

The above object and features of the present invention will become apparent to those skilled in the art upon reading the following detailed description with reference to the accompanying drawings in which:

DETAILED DESCRIPTION OF THE PREFERRED EMBODIMENT

One preferred embodiment of an apparatus for stabilizing the wavelength/output power of a semiconductor laser according to the present invention will be described hereunder with reference to the accompanying drawings.

Figure 5:
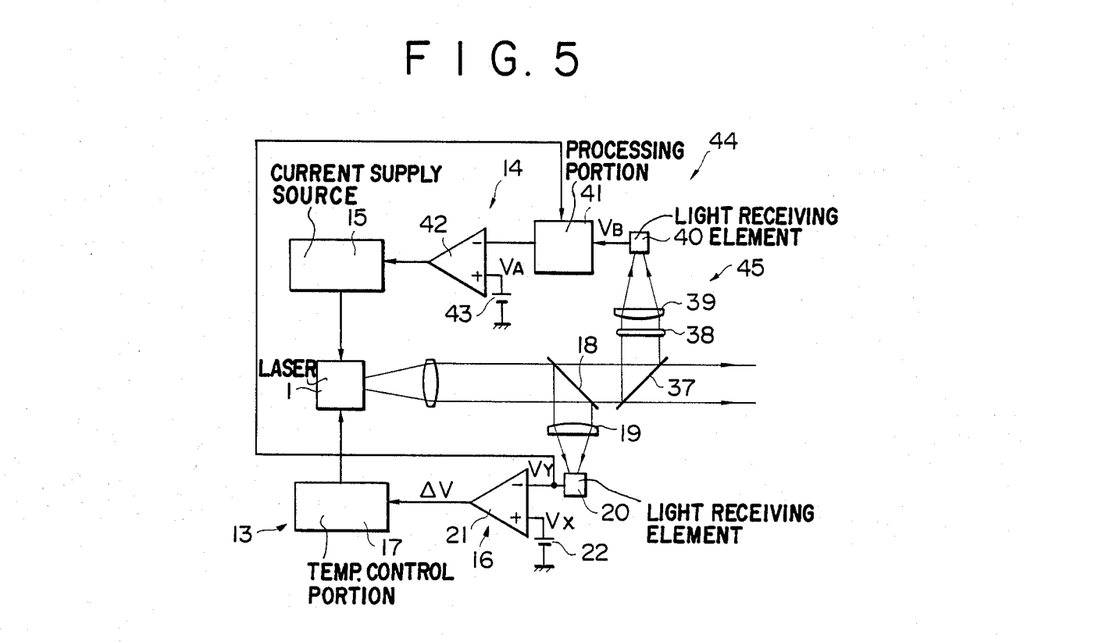
FIG. 5 is a schematic view showing the whole construction of an apparatus for stabilizing the wavelength/output power of a semiconductor laser according to the present invention.
Figure 6:
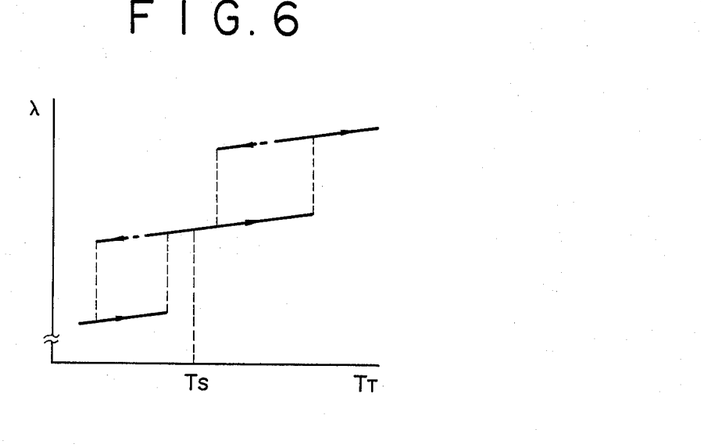
FIGS. 6 and 7 are illustrations showing the mode jump characteristics of the semiconductor laser according to the present invention.
Figure 7:
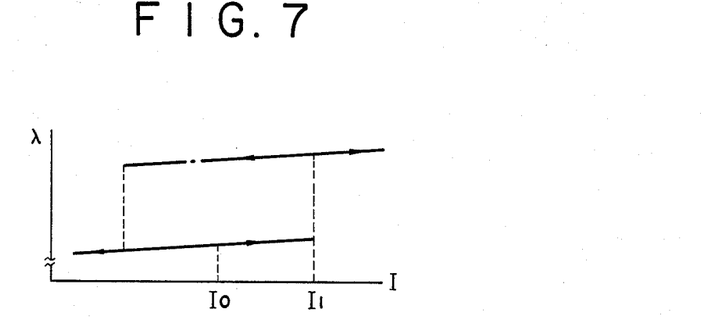

FIG. 5 is an illustration showing the construction of an important part of an apparatus for stabilizing the wavelength/output power of a semiconductor laser. The apparatus for stabilizing the wavelength/output power of a semiconductor laser includes an operating temperature stabilizing portion 13, an injection current controlling portion 14, an injection current supplying source 15, an output power variation detecting portion 16, and a wavelength variation detecting portion 44. The wavelength output power variation detecting portion 16 has such function as to detect the variation of the wavelength output power by receiving a part of the wavelength output power of the semiconductor laser 1. The output power variation detecting portion 16 generally comprises a beam splitter 18, a condenser lens 19, a light receiving element 20, and an operational amplifier 21. One terminal of the operational amplifier 21 is connected to a reference voltage $V_x$ of a reference power source 22, and the other terminal thereof is connected to an output $V_y$ of the light receiving element 20. The reference voltage $V_x$ corresponds to a predetermined output level of the semiconductor laser 1 and is set as such that the output of the operational amplifier 21 becomes zero when the semiconductor laser outputs a predetermined level. In the case of an ordinary semiconductor laser having a Fabry-Perot resonance structure, a mode jump is produced based on the variation of an operating temperature $T_T$ as shown in FIG. 6, and a wavelength λ is shifted. The mode jump characteristic of this semiconductor laser has a hysteresis. Therefore, in order to stabilize the osciallatin of the semiconductor laser 1, it is preferred that a specified temperature $T_S$ is selected in a stable area in which this mode jump is difficult to occur. The operational amplifier 21 outputs an output V which is equal to the difference between the reference voltage $V_x$ and the output $V_y$ towards an operating temperature controlling portion 17.

Figure 8:
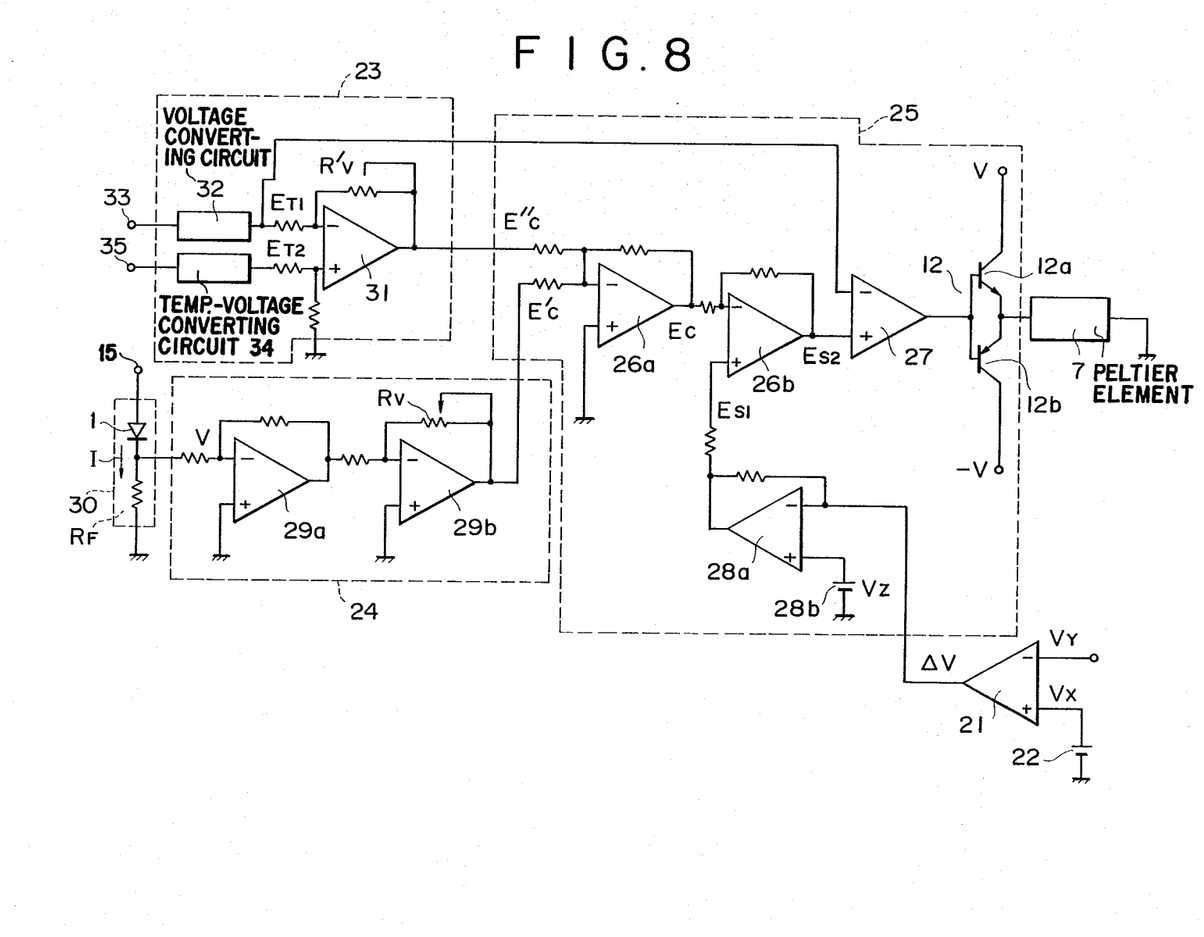
FIG. 8 is an illustration showing the construction of the operating temperature controlling portion of FIG. 5 in detail.
Figure 9:
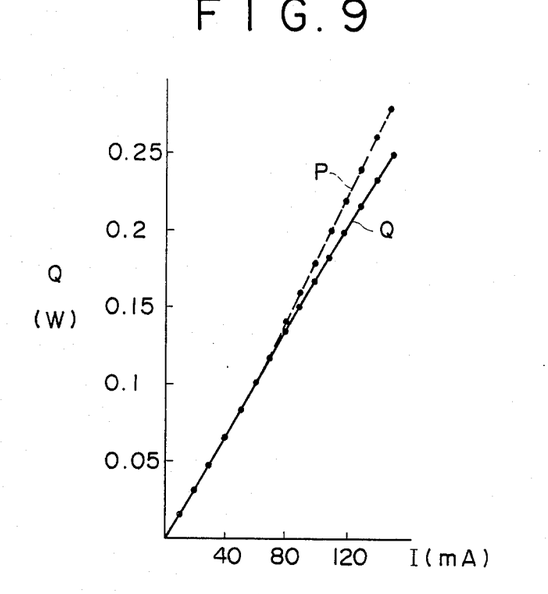
FIG. 9 is a characteristic illustration showing the relation between an injection current and a heat value of the semiconductor laser of FIG. 5.

The operating temperature stabilizing portion 13 has an operating temperature controlling portion 17, a Peltier element 7, and thermistors 33 and 35 which are equivalent to the operating temperature detecting portion. The operating temperature controlling portion 17, as shown in FIG. 8, includes a difference output power generating circuit 23 having a function which will be described hereinafter, a heat correcting output generating circuit 24 having a function which will be described hereinafter, and a thermoelectric element controlling portion 25 for controlling the Peltier element 7 acting as the thermoelectric element. The thermoelectric element controlling portion 25 includes an operational amplifier 26a, an operational amplifier 26, an operational amplifier 27 and an operational amplifier 28a. One terminal of the operational amplifier 26a is grounded, and the other terminal thereof is inputted with a heat correcting voltage E'c and a difference correcting voltage E"c to output a correcting voltage Ec. This correcting voltage Ec has a physical quantity which is in proportion to the heat value of the semiconductor laser 1 and the temperature difference ΔT between the environmental temperature $T_h$ and the specified temperature $T_S$. The details of the correcting voltage Ec will be described hereinafter. One terminal of the operational amplifier 28a is inputted with an output ΔV of the operational amplifier 21, and the other terminal thereof is inputted with a reference voltage Vz of a standard power source 28b. A comparator 28a transmits an output $E_{S1}$ which is equivalent to the difference between the reference voltage Vz and the output ΔV of the operational amplifier 21 to the operational amplifier 26b. This reference voltage Vz transmits the output $E_{S1}$ corresponding to the specified temperature Ts to the operational amplifier 26b. The operational amplifier 26b outputs a correcting reference voltage $E_{S2}$ which is equivalent to the difference $E_{S1} - E_C$ between the output $E_{S1}$ and the correcting voltage $E_C$ towards the other terminal of the operational amplifier 27. The operational amplifier 27 compares the operating temperature converting voltage $E_{T1}$ which is inputted into one terminal thereof and the correcting reference voltage $E_{S2}$, controls the transistor 12 by the output of the difference between the voltages $E_{T1}$ and $E_{S2}$ and controls the Peltier element 7 so that the operating temperature $T_T$ reaches the balanced-state by the transistor 12.

Assuming that the operating temperature $T_T$ reached the balanced-state by the control just mentioned, the relation (9) can expressed using the correcting reference voltage $E_{S2}$ as follows;

$$Ee = E_{S2} + \frac{Q}{\alpha \cdot \beta} - \frac{\Delta T}{\alpha \cdot \gamma} \quad (10)$$

Since $E_{S2} = E_{S1} - E_C$, the relation (10) can be rewritten as follows;

$$Ee = E_{S1} - E_C + \frac{Q}{\alpha \cdot \beta} - \frac{\Delta T}{\alpha \cdot \gamma} \quad (11)$$

In order to bring the balanced-temperature Te in agreement with the specified temperature $T_S$, the difference between the reference voltage $E_{S1}$ and the balanced-temperature corresponding voltage Ee must be "0".

Under the above-mentioned condition, the relation (11) can be rewritten as follows;

$$E_e - E_{S1} = -E_C + \frac{Q}{\alpha \cdot \beta} - \frac{\Delta T}{\alpha \cdot \gamma} = 0$$

The following relation can then be obtained from the above relation;

$$E_C = \frac{Q}{\alpha \cdot \beta} - \frac{\Delta T}{\alpha \cdot \gamma} \quad (12)$$

Assuming that the following conditions are given to the relation (12);

$$E_C' = \frac{Q}{\alpha \cdot \beta} \quad (13)$$

$$E_C'' = -\frac{\Delta T}{\alpha \cdot \gamma} \quad (14)$$

$E_C = E_C' + E_C''$ is obtained.

$E_C'$ physically means a heat correcting voltage which is required to correct the gap between the operating temperature $T_T$ and the specified temperature $T_S$ based on the heat of the semiconductor laser 1, whereas $E_C''$ physically means a difference correcting voltage which is required to correct the gap between the operating temperature $T_T$ and the specified temperature $T_S$ based on the difference between the operating temperature $T_T$ and the specified temperature $T_S$. Therefore, if the correcting voltages $E_C'$ and $E_C''$ are added as the controlling voltage $E_C$, the balanced-temperature Te when the operating temperature $T_T$ reaches the balanced-state can be brought to be in agreement with the specified temperature $T_S$.

Figure 10:
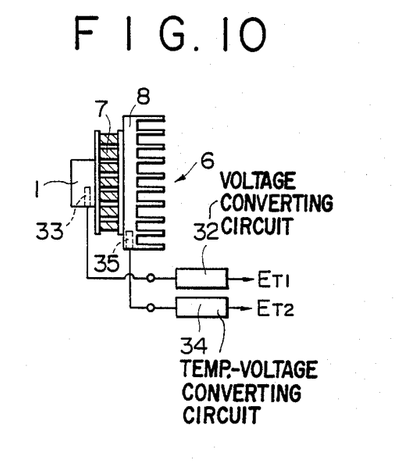
FIG. 10 is an illustration showing the construction of a thermoelectric converter according to the present invention.

The heat correcting output generating circuit 24 has such function as to generate the heat correcting voltage $E_C'$ and includes operational amplifiers 29a and 29b. The operational amplifier 29a is inputted with a detecting output from a heat value detecting portion 30. The heat value detecting portion 30 includes a stationary resistor R. Assuming that the heat value Q of the semiconductor laser 1, as shown in FIG. 10, is in proportion to the injection current I and that the stationary resistor $R_F$ is provided in the midway of a serial circuit including an injection current supplying source 15 for supplying the injection current I to the semiconductor laser 1, the potential fall V of the stationary resistor $R_F$ is in proportion to the injection current I.

The above can be expressed using a numerical formula as follows;
since $Q = C \times I_{LD}$ and $V = R_F \times I_{LD}$, $$V = R_F \cdot \frac{Q}{C} \quad (15)$$

wherein symbolic character C is a converting coefficient.

The voltage V is inputted into one terminal of the operational amplifiers 29a and 29b, and the amplification factor m is adjusted.

Since the output voltage outputted from the operational amplifier 29b is used as the heat correcting voltage $E_C'$, $E_C' = mV$ is obtained. According to this relation $E_C' = mV$ and the afore-mentioned relations (13) and (15), the amplification factor m can be expressed as follows;

$$m = \frac{C}{R_F} \cdot \frac{1}{\alpha \cdot \beta} \quad (16)$$

Since all of the physicalquantities which are included in the right term in the above relation (16) can be regarded as constants, the amplification factor m is constant.

Since this amplification factor m is M<1 and the nonreverse amplification cannot be performed directly, the reverse amplification is repeated twice in this embodiment.

The difference correcting output generating circuit 23 has such function as to generate the difference correcting voltage $E_C''$. This difference correcting output generating circuit 23 includes an operational amplifier 31. The detecting output of the thermistor 33 is converted to a voltage $E_{T1}$ by a temperature-voltage converting circuit 22 and then inputted into one end of the operational amplifier 31, whereas the detecting output of the thermistor 35 is converted to a voltage $E_{T2}$ by a temperature-voltage converting circuit 34 and then inputted into the other end of the operational amplifier 31. The thermistor 33, as shown in FIG. 10, is contained in the semiconductor laser 1 and mounted on a radiating plate 8, thereby constituting the thermoelectric converter 6. The thermistor 33 acts as the operating temperature detecting portion for detecting the operating temperature $T_T$ of the simiconductor laser 1. The thermistor 35 acts as the environmental temperature detecting portion for detecting the environmental temperature T. The detecting output $E_{T1}$ corresponds to the operating temperature $T_T$, whereas the detecting output $E_{T2}$ corresponds to the environmental temperature $T_h$. The operational amplifier 31 has such function as to generate a voltage $V_D$ which is in proportion to the temperature difference T between the environmental temperature $T_h$ and the operating temperature $T_T$.

If the temperature/voltage converting coefficient is represented by n, the relation between T and voltage $V_D$ can be expressed as follows;

$$V_D = n \cdot \Delta T \quad (17)$$

Therefore, if the amplification factor m' is adjusted by a variable resistor $R_V'$ which is connected to the operational amplifier 31, the following relation is obtained;

$$E_C'' = -\frac{\Delta T}{\alpha \cdot \gamma} = m' \cdot V_D = m' \cdot n \cdot \Delta T$$

Thus, the amplification factor m' is expressed as follows;

$$m' = -\frac{\Delta T}{n \cdot \alpha \cdot \gamma} \quad (18)$$

Therefore, if the amplification factors m and m' are adjusted, the variation of the operating temperature $T_T$ based on the heat value Q of the semiconductor laser 1 and the temperature difference $\Delta T$ between the environmental temperature $T_h$ and the operating temperature $T_T$ can be removed.

In the operating temperature stabilizing circuit 13, when the output power P of the semiconductor laser 1 is successively varied, the output $E_{S1}$ is varied according to variation of the output power P by the operational amplifiers 21 and 28a. Based on the output $E_{S1}$, the operational amplifiers 26 and 27 controls the transistor 12 so as to maintain the output power P constant while taking the correction between the heat and the temperature difference T into consideration.

In FIG. 5, a wavelength variation detecting portion 44 includes a light receiving portion 45 and a processing portion 41.

The light receiving portion 45 includes a beam splitter 37, an optical element 38 such as an interference filter in which the spectal characteristics are varied in the wavelength bandwidth of the semiconductor laser, a condenser lens 39, and a light receiving element 40. This light receiving element 40 receives a part of the output power of the semiconductor laser 1 through the optical element 38. The processing portion 41 comprises a divider, etc. It receives an output Vx of the light receiving element 20 which receives a part of the output power of the semiconductor laser 1 and an output Va of the light receiving element 40 which receives a part of the output power of the semiconductor laser 1 through the optical element 38, performs a calculation of Va/Vx (=Vc), obtains the variation of the wavelength of the semiconductor laser 1, and then outputs it as Vc.

Figure 11:
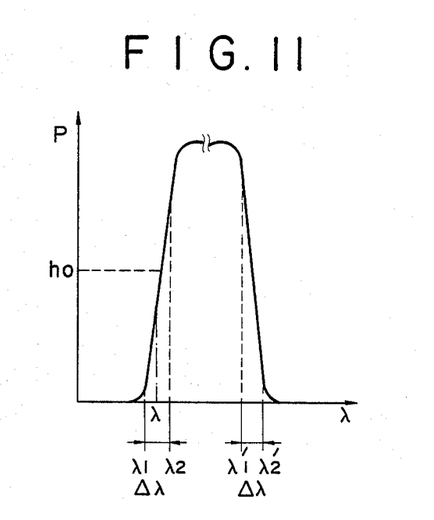
FIG. 11 is a characteristic illustration of a transmittance curve of an optical element of FIG. 5.

In this embodiment, an interference filter is used as the optical element 38. FIG. 11 is an illustration showing a transmittance curve with respect to the wavelength of this interference filter. The interference filter has such function as to pass a light of a predetermined wavelength bandwidth, and an interference filter having a sharp leading edge and a sharp trailing edge. In FIG. 11, $\lambda_1 \sim \lambda_2$ indicates a wavelength bandwidth within the range of the leading edge, whereas $\lambda_1' \sim \lambda_2'$ indicates a wavelength bandwidth within the range of the trailing edge. The interference filter is generally linearly raised and downed within the wavelength bandwidths $\lambda_1 \sim \lambda_2$ and $\lambda_1' \sim \lambda_2'$. $\Delta\lambda \equiv \lambda_1 \sim \lambda_2$ and $\Delta\lambda \equiv \lambda_1' \sim \lambda_2'$ are 50 to 90 A. Therefore, if the wavelength of the semiconductor laser 1 is set as follows;

$$\lambda \approx \frac{\lambda_1 + \lambda_2}{2} \left( \approx \frac{\lambda_1 + \lambda_2}{2} \right)$$

when the wavelength is varied, the output power P which is guided to the light receiving element 40 after passing through the optical element 38 is largely varied. Accordingly, the variation of the wavelength can be very accurately monitored by detecting the variation of the output power P passing through the optical element 38.

The optical element 38 is set in such a manner as will be described hereinafter. The afore-mentioned mode jump is also occurred due to variation of the injection current I.

Therefore, the injection current $I_O$ is set in the area in which such mode jump does not occur. In a system in which a wavelength is locked using a Fabry-Perot etalon plate and an atomic/molecular absorption spectrum, the wavelength is sometimes locked in the area in which the mode jump is readily occurred. However, according to a wavelength/output power stabilizing apparatus of the present invention, the area in which the mode jump is difficult to occur can be selected. Since the semiconductor laser 1 is already set as such that the injecion current I and the operating temperature $T_T$ are oscillated in the stabilizing area, the semiconductor laser 1 i oscillated, and the output $V_B$ of the light receiving element 40 is obtained under the condition that the optical element 38 is not inserted between the beam splitter 37 and the condenser lens 39. The optical element 38 is then inserted between the beam splitter 37 and the condenser lens 39. The optical element 38 is designed beforehand as such that the following item;

$$\lambda \approx \frac{\lambda_1 + \lambda_2}{2}$$

is slightly closer to the long wavelength than the wavelength $\lambda_0$ of the semiconductor laser. Upon insertion, if the optical element 38 is gradually inclined with respect to an optical path, the transmittance curve is shifted toward the side in which the wavelength becomes shorter while maintaining its configuration. Accordingly, by inclining the optical element 38, a place in which the output $V_B$ of the light receiving element 40 becomes $h_oP_o$ can be selected. $H_o$ used herein is a value in the output power P becomes approximately ½, and the output power $P_o$ of the light receiving element 40 is measured by other means. In that state, the reference power source 43 is adjusted so that the output of the operational amplifier becomes zero. One which uses this optical element 38 has such function as almost similar to the etalon plate, atomic/molecular absorption spectrum, etc. without using a large-sized wavelength reference such as etalon plate, atomic/molecular absorption spectrum as a wavelength reference. In addition, it has such advantages as that it can be made small and at low cost. Even when a semiconductor laser 1 having a different wavelength is used, it can be properly set merely by altering the design value of the optical element 38 and inclining the optical element 38.

Although the leading edge portion at the short wavelength side of the transmittance curve is used in this embodiment, the léading edge portion at the long wavelength side can be used.

The transmittance curve of the optical element 38 is also varied according to variation of environmental temperature, moisture, etc., this variation is negligibly small compared with variation of the wavelength of the semiconductor laser 1 based on variation of operating temperature. When the variation of this transmittance curve is eagerly restricted, the temperature of the optical element 38 is maintained constant using a temperature stabilizing circuit, or otherwise the moisture may be prevented by a covering glass.

The injection current controlling portion 14 comprises an operational amplifier and a reference power source 43. It controls the injection current I of the injection current source 15 based on the output Vc of the processing portion 41 so that the wavelength becomes constant.

One terminal of the operational amplifier 42 is inputted with the output Vc of the processing portion 41, and the other terminal thereof is inputted with the reference voltage $V_A$ of the reference power source 43.

This reference voltage $V_A$ is adjusted to the level equal to the output Vc of the processing portion 41 when the semiconductor laser maintains a predetermined wavelength and a predetermined output.

The operational amplifier 42 outputs the difference of the output Vc of the processing portion 41 and the reference voltage $V_A$ to the injection current supplying source 15.

The injection current supplying source 15 supplies an injection current of the value according to the output Vc of the operational amplifier 42 to the semiconductor laser 1. Therefore, when the wavelength of the semiconductor laser is varied, the operational amplifier 42 transmits the output for restricting the variation to the injection current supplying source 15 and rapidly controls the injection current so that the variation of the wavelength becomes smaller.

Therefore, when the wavelength is varied for some reasons, the wavelength/output power stabilizing apparatus of a semiconductor laser according to the present invention increases or decreases the injection current I according to the variation thereof, and the wavelength is maintained in its stabilized state. At the time, although the output power P is varied by variation of the injection current I, the variation of the output power P is detected by the output power variation detecting portion 16 and the operating temperature controlling portion 17 controls the operating temperature $T_T$ so that the variation becomes smaller. In this case, since a bias is added to the operating temperature controlling portion 17 so as to approach to the specified temperature $T_S$ while correcting at least the heat based on injection current I, the output power P can be smoothly maintained in its stabilized state even if the responding speed of the Peltier element 7 is slow.

If the output power of the semiconductor laser 1 is varied by some reasons, the operating temperature stabilizing portion 13 controls the operating temperature $T_T$ so as to maintain the output power P in its stabilized state. Since the operating temperature controlling portion 17 is added with the bias so as to approach to the specified temperature $T_S$, the output power P can be smoothly maintained in its stabilized state even if the responding speed of the Peltier element 7 is slow. Although the variation of the operating temperature $T_T$ adversely affects the wavelength λ, the injection current controlling portion 14 rapidly controls the injection current I so as to maintain the predetermined wavelength.

As described in the foregoing, an apparatus for stabilizing the wavelength/output power of a semiconductor laser according to the present invention includes an injection current supplying source for supplying an injection current to a single-modesemiconductor laser; an output power variation detecting portion for detecting the variation of the output power by receiving a part of the output power of semiconductor laser; a wavelength variation detecting portion which has a light receiving portion for receiving a part of the output power of the semiconductor laser through an optical element whose spectral characteristics are varied in the wavelength area of the semiconductor laser and a processing portion for obtaining a variation of the wavelength of the semiconductor laser based on the output of the light receiving portion and the output of the output power variation detecting portion; a heat value detecting portion for detecting a heat value which said semiconductor laser generates, an operating temperature stabilizing portion which comprises an operating temperature detecting portion provided to the semiconductor laser and adapted to detect an operating temperature thereof, a thermoelectric element for forwarding and receiving heat to and from the semiconductor laser, and an operting temperature controlling portion for controlling the thermoelectric element so as to bring the operating temperature in accord with a specified temperature while maintaining the output power constant based on a reference signal corresponding to the specified temperature, an output of the heat value detecting portion, and an output of the output power variation detecting portion; and an injection current controlling portion for controlling the injection current of the injection current source so as to maintain the wavelength constant based on an output of the wavelength variation detecting portion. Accordingly, both the wavelength and output power of the semiconductor laser can be stabilized for a long time.

While it will be apparent that the preferred embodiment of the present invention herein disclosed is well calculated to fulfill the object stated above, it will be appreciated that the present invention is susceptible to modification, variation and change without departing from the proper scope of fair meaning of the appended claims.

What is claimed is:

1. An apparatus for stabilizing the wavelength and output power of a semiconductor laser comprising:

an injection current supplying source for supplying an injection current to a single-mode semiconductor laser;

an output power fluctuation detecting means for detecting the fluctuation of said output power by receiving a part of the output power of said semiconductor laser;

a wavelength variation detecting means having a light receiving means for receiving a part of the output power of said semiconductor laser through an optical element whose spectral characteristics vary the wavelength bandwidth of said semiconductor laser, and a processing means for obtaining a variation of the wavelength of said semiconductor laser based on the output of said light receiving means and the output of said output power variation detecting means;

a heat value detecting means for detecting a heat value of said semiconductor laser;

an operating temperature stabilizing means which includes an operating temperature detecting means for detecting an operating temperature of said semiconductor laser;

a thermoelectric element means for forwarding and receiving heat to and from said semiconductor laser, and an operating temperature controlling means for controlling said thermoelectric element so as to bring the operating temperature in accordance with a specified temperature while maintaining the output power constant based on a reference signal corresponding to the specified temperature, an output of said heat value detecting means, and an output of said output power variation detecting means; and an injection current controlling means for controlling the injection current of said injection current source to maintain the wavelength constant based on an output of said wavelength variation detecting means.

2. The apparatus as claimed in claim 1, wherein said output power fluctuation detecting means includes a beam splitter disposed in the midway of a radiating optical path of said semiconductor laser and adapted to reflect a part of the output power;

a condenser lens for collecting the beam reflected by said beam splitter;

a light receiving element means for receiving the beam collected by said condenser lens; and an operational amplifier, one input terminal of which is connected to said light receiving element and the other input terminal of which is connected to a reference voltage.

3. The apparatus as claimed in claim 1, wherein said operating temperature controlling means includes a difference correcting output generating circuit means for generating a difference correcting voltage based on said temperature detected by said operating temperature detecting means in order to correct a gap between said operating temperature and said specified temperature based on a difference between said operating temperature and said specified temperature;
 a heat correcting output generating circuit means for generating a heat correcting voltage based on a detected value of said heat value detecting means in order to correct a gap between said operating temperature and said specified temperature based on the heat of said semiconductor laser; and
 a thermoelectric element controlling means for controlling said thermoelectric element based on said heat correcting voltage, said difference correcting voltage, and the output of said output power variation detecting means.

4. The apparatus as claimed in claim 1, wherein said wavelength variation detecting means includes a beam splitter in which said light receiving portion is disposed in the midway of the radiating optical path of said semiconductor laser and a part of the output power is reflected towards said optical element;
 a condenser lens for collecting the reflected beam which passes through said optical element; and
 a light receiving element for receiving the beam collected by said condenser lens and outputting the beam to said processing means.

5. The apparatus as claimed in claim 1, wherein said thermoelectric element means is a solid state device employing the Peltier effect to pump heat from one surface to another.

6. The apparatus as claimed in claim 1, wherein said semiconductor laser is of a Fabry-Perot resonance structure, and said specified temperature is selected in a stable area in which a probability of occurrence of mode jump is small.

7. The apparatus as claimed in claim 1, wherein said optical element is an interference filter and said interference filter is of the type that spectral characteristics thereof are radically varied.

8. The apparatus as claimed in claim 1, wherein said injection current of said injection current supplying source is selected in an area in which a probability of occurrence of a mode jump is small.

* * * * *